United States Patent [19]

Pleitz et al.

[11] Patent Number: 5,521,792

[45] Date of Patent: May 28, 1996

[54] SPLIT SHIELD AMPLIFIER HOUSING AND MOUNT

[75] Inventors: John J. Pleitz, Tempe; Loyd L. Ivey, Chandler, both of Ariz.

[73] Assignee: Mitek Corporation, Phoenix, Ariz.

[21] Appl. No.: 505,930

[22] Filed: Jul. 24, 1995

[51] Int. Cl.$^6$ .................................................. H05K 7/20
[52] U.S. Cl. ............................................. 361/715; 361/690
[58] Field of Search ............................... 165/80.2, 80.3, 165/185; 174/16.3; 361/688, 690, 704, 707–722, 728–729, 730, 752, 753, 141, 144–145

[56] References Cited

U.S. PATENT DOCUMENTS

| | | | |
|---|---|---|---|
| 4,656,559 | 4/1987 | Fathi | 361/721 |
| 4,858,071 | 8/1989 | Manabe et al. | 361/711 |
| 5,057,971 | 10/1991 | Hautvast et al. | 361/716 |

*Primary Examiner*—Gregory D. Thompson
*Attorney, Agent, or Firm*—Quarles & Brady

[57] ABSTRACT

A simplified amplifier housing and mounting system, the housing comprising three components, a top member having a top wall and two lateral walls, and two bottom members which together form a base wall, each bottom member also providing an end wall for the housing. Electrically isolating mounting extensions are removably secured to the under surface of the base wall for mounting adjustment purposes.

11 Claims, 4 Drawing Sheets

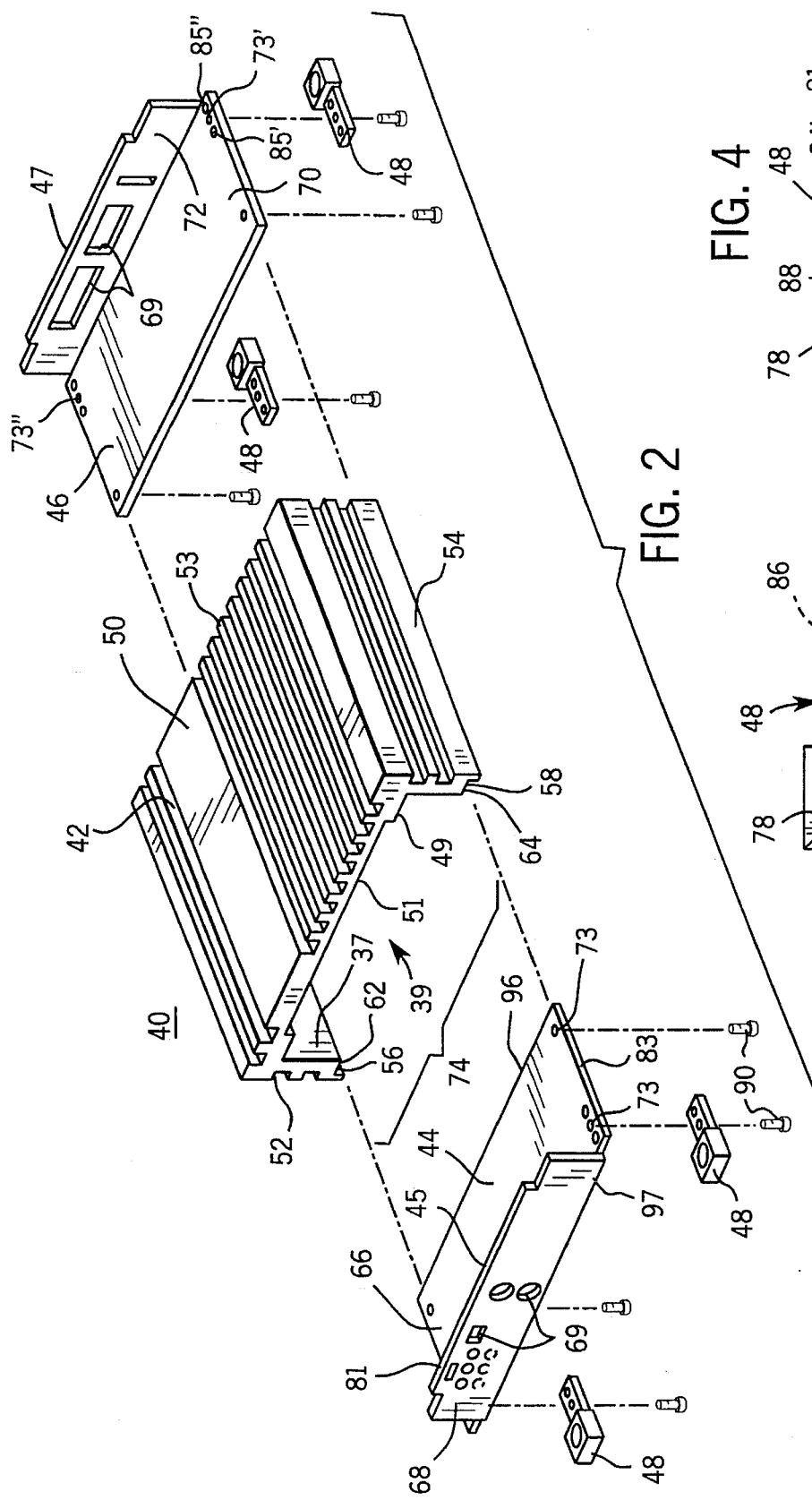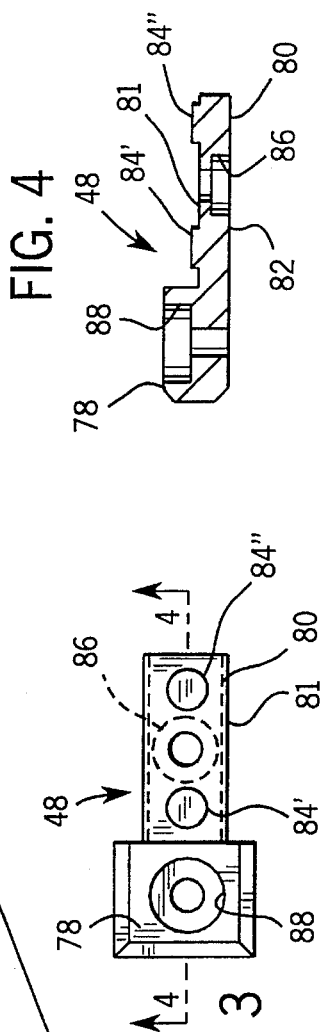

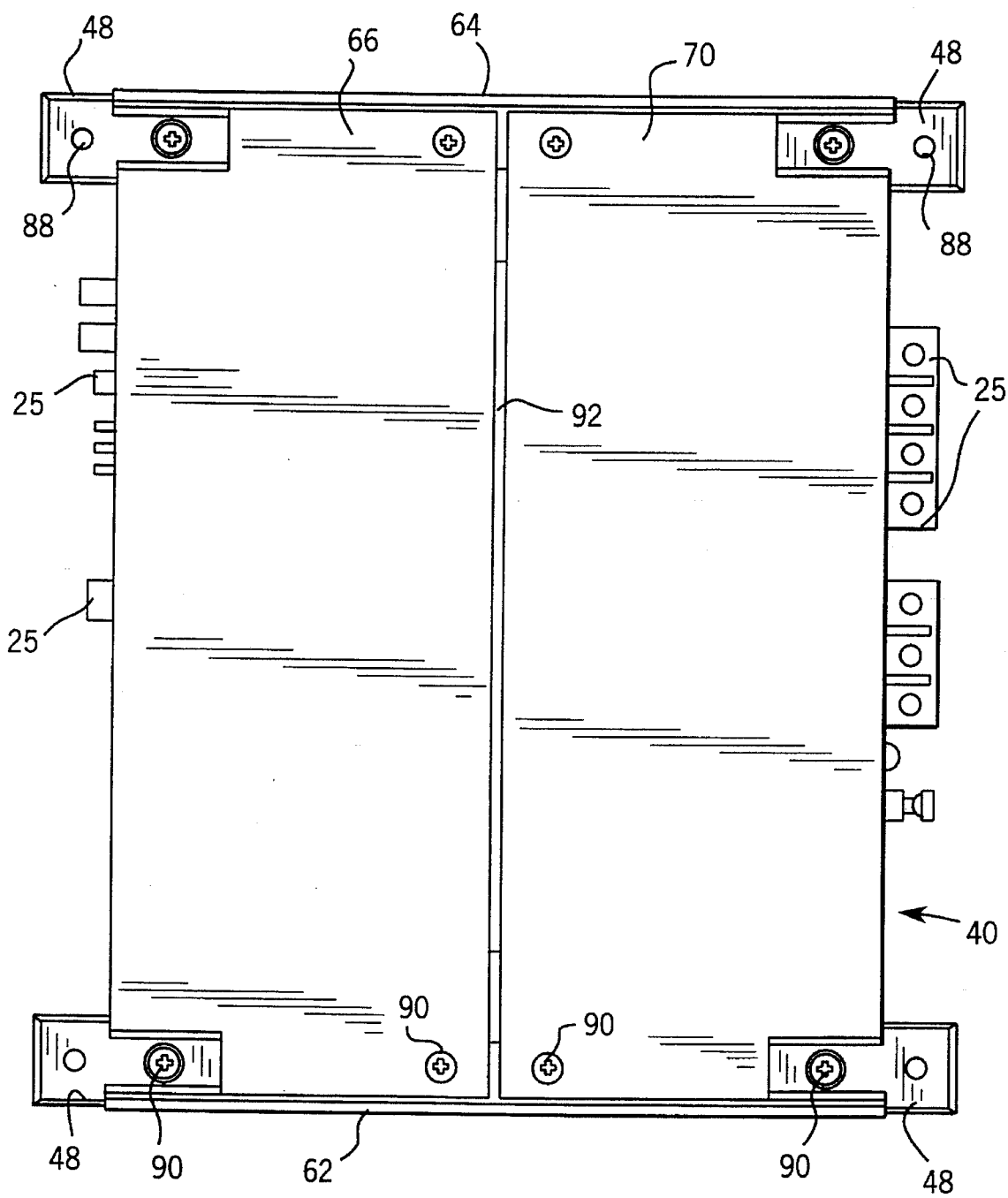

SPLIT SHIELD AMPLIFIER HOUSING AND MOUNT

FIELD OF THE INVENTION

The present invention relates to automobile stereo amplifiers, and in particular, to amplifier housing and mounting components.

BACKGROUND OF THE INVENTION

Referring to FIG. 1, housings for mobil power amplifiers, such as those used in automobiles, or the like, typically include a large heat dissipating heat sink 10 forming a top wall 12 and two lateral side walls 14, 16 which extend downwardly from oppositely facing lateral edges of the top wall 12. Lateral foot extensions 18, 20 which form integral portions of the heat sink 10 extend outwardly from the distal lower ends of the lateral side walls 14, 16 and form mounting apertures 22. Oppositely facing heat sink front and back edges 24, 26, respectively, define an open area which allow power, ground, and input and output mechanical hook-ups. Screw holes 31 are provided on both the front and back edges 24, 26. The top member 10 defines two co-planar recesses 28, 30 on facing surfaces of the lateral side walls 14, 16 near the lower distal ends.

In addition, the casing typically includes a base plate 29 received in the recesses 28, 30 to form a casing lower wall, and two oppositely facing front and back plates 32, 34 respectively. Once the base plate 29 is inserted between recesses 28, 30, the front and back plates 32, 34 are securely fastened to the front and back edges 24, 26 respectively via screws 36 extending through plates 32, 34 and into holes 31.

When located for use, the entire housing should be secured to a flat surface to minimize agitation of the amplifier and in particular the amplifier electronics, thus prolonging the amplifiers useful life. When an amplifier is improperly secured, vibration and collision with nearby items can cause serious damage to both the amplifier components and surrounding items.

To properly mount an amplifier, mounting bolts (not shown) extend through mounting apertures 22 and into a flat support surface. The flat surface is usually an electrically conductive surface connected to an automobile chassis so that after mounting, the surface and chassis operate as an amplifier ground.

In addition to acting as a heat sink for dissipating amplifier heat, as a mounting means and as a ground, the above described housing acts as an amplifier protector to eliminate physical contact with amplifier components. The top member 10 is typically formed of an extruded aluminum which can absorb substantial impact. Nevertheless, where impact is sufficient, the amplifier housing can become damaged. Typical housing damage includes marred or even functionally damaged foot extensions 18, 20 resulting from the heat sink 10 moving to absorb impact force. Where an amplifier can be located in a "hidden space", disfiguring housing damage is relatively unimportant. However, where a damaged housing cannot function properly to protect, mount, or dissipate heat, the damaged portion must be replaced.

While the above described amplifier housing and similarly designed housings have been widely used throughout the mobile audio power amplifier industry for many years, the disadvantages associated with such housings have become increasingly important as typical amplifier environments have changed significantly. For example, suitable hidden space within an automobile has becomes less available as more compact automobiles are designed and more existing hidden space is required to house new or improved factory installed option hardware. Even where sufficient hidden space exists, it is often the case that no defining wall surrounding the space forms a completely flat surface large enough to securely support an amplifier. Many times defining walls are curved to conform to the external shape of an automobile or the internal shape of a passenger compartment or are formed with ribs to increase wall strength.

Where suitable hidden space is not available, add on automotive equipment must be located in relatively more suitable and easily observable locations such as the rear section of a utility vehicle, the hatchback of a small car, or the trunk of a sedan. Housing appearance is important where an amplifier is observable when operationally located. When an amplifier is observable, exposed securing screw heads on the front and back plates are undesirable. This is particularly true where an amplifier is located in an automobile and the entire internal environment of the automobile is completely finished which is almost universally the case.

The above described housing configuration offers no way to hide or cover the securing screw heads. Other housing configurations which do hide screw heads are more complex requiring additional specially designed and manufactured components. These specially designed components are relatively expensive and difficult to install.

In addition, while marred housing surfaces may be acceptable when hidden, such disfiguring damage, even where the damage does not affect amplifier performance, is undesirable where the housing is observable within a automobile. Even slightly damaged housings should be replaced. The heat sink 10 is a single integral piece, and therefore where the heat sink 10 is damaged, the entire sink must be replaced. Because the heat sink is a complex extrudate, replacement is typically expensive. Unfortunately it is usually the top heat sink member 10 and lateral foot extensions 18 and 20 which absorb unintended blows and becomes disfigured.

Another problem with the above described housing configuration is that there is no easy way to mitigate ground loop noise. Ground loop noise is caused when two or more points in an electrical system that are nominally at ground potential are connected by a conducting path such that the two points are not at the same ground potential. In an automobile, the automobile chassis is typically connected to battery ground so that, any component connected to the chassis is theoretically connected to a unipotential ground point. In reality, however, because automobile stereo components will typically be connected to ground through special grounding wires which are characterized by different lengths and resistances, in fact, the direct connections to system components may have slightly different potentials. With an amplifier, where the amplifier is grounded through a grounding wire and the conductive housing is also grounded, ground loop potential possibilities exist.

Yet a further problem with the above described configuration is that it provides a transmission path along the bottom plate for transmitting magnetic flux generated by a power transformer which is a standard component in all amplifiers. This can produce unintended signal and system noise as transformer windings cause a current in the bottom plate which produces a magnetic field which in turn alters input signals by slightly changing input currents (through transformer action).

Therefore, it would be advantageous to have a mobile amplifier housing and mounting system which substantially eliminates observable and unfinished screw heads, limits the affects of stray magnetic flux and ground loop noise, minimizes the costs associated with replacing housing and mounting components, and which can be manufactured and installed inexpensively.

SUMMARY OF THE INVENTION

The present invention includes an amplifier housing configuration wherein the housing primarily consists of three components, a top heat sink and two bottom plates. The top heat sink forms a top wall and two opposing lateral walls, front and back edges of the top sink being open. The space between the two opposing lateral walls defines an amplifier electronics housing area. Each bottom plate forms a bottom section that traverses the distance between the two lateral walls and which is preferably approximately half the size of the top wall. Each bottom plate also either forms a front or a back wall extending upwardly from an associated bottom section. When assembled the heat sink and two bottom plates form a rectangular volumetric housing, the bottom sections forming a wall opposite the top wall and the front and back walls located adjacent the front and back top sink edges respectively while the top heat sink is formed out of extruded aluminum, each bottom plate is formed out of less expensive and easily tooled sheet metal.

No screws are required to hold the front and back walls adjacent the front and back edges. Rather, the bottom sections are secured to a lower edge of each lateral wall. The front and back walls, which are integrally attached to the bottom sections, are held in their desired end blocking positions.

One object of the invention is to provide an amplifier housing configuration with minimal components where all securing screws are hidden. All screws used to secure housing components together can be hidden by positioning them on the underside of the bottom sections, the bottom sections being hidden after the housing is properly mounted. The number of housing parts is limited by providing the front and back walls as integral sections of the bottom plates.

Another object of the invention is to eliminate or substantially minimize magnetic flux through the bottom of the housing which is caused by a power transformer in the amplifier. Flux can be minimized by designing the bottom sections so that, after installation, a slight gap (i.e. open circuit) exists between the two bottom sections. This reduces undesirable amplifier noise.

The invention also includes a plurality of separate amplifier mounting feet formed out of electrically insulative material. Preferably, four feet are provided, each foot extending from the bottom section underside of a constructed housing, one foot extending from each of the four corners of the housing. Another object is to insulate the amplifier housing from an automobile chassis to limit ground loop noise. The electrically insulating foot extensions elevate the amplifier housing above the chassis and eliminate any ground loop noise.

The mounting feet are constructed out of a semi-pliable material so that they can bend or conform slightly to supporting structure. Another object of the invention is to provide a system whereby an amplifier can be sufficiently secured to an uneven surface, thus making certain hidden areas useable which would not have previously been useable for mounting purposes.

A further object is to isolate the top heat sink from the mounting structure thus eliminating a major source of heat sink damage. Where an integral portion of the heat sink forms a mounting means, the heat sink absorbs nearly all impacting force which can either mar or damage the sink. By connecting the mounting feet to the bottom sheet metal plates instead of the sink, most impact force will be absorbed by either the mounting feet or the sheet metal plates. Slight damage to either the feet or sheet metal plates will be less visible than damage to the heat sink and therefore can usually be ignored. Where damage to the feet or sheet metal plates is substantial, these components can be replaced at minimal cost compared to the expense of replacing the heat sink.

These and still other objects and advantages of the invention will become apparent from the description which follows. In the description, the preferred embodiments will be described with reference to the accompanying drawings. These embodiments do not represent the full scope of the invention. Rather, reference should be made to the claims herein for interpreting the full scope of the invention.

BRIEF DESCRIPTION OF THE DRAWINGS

FIG. 2 is an exploded view of the housing and mounting system of the present invention;

FIG. 3 is a top plan view of a foot extension member of the present invention;

FIG. 4 is a cross-sectional view taken along the line 4—4 FIG. 3;

FIG. 6 is a bottom perspective view of the housing according to the present invention;

DESCRIPTION OF THE PREFERRED EMBODIMENT

Figure 1:
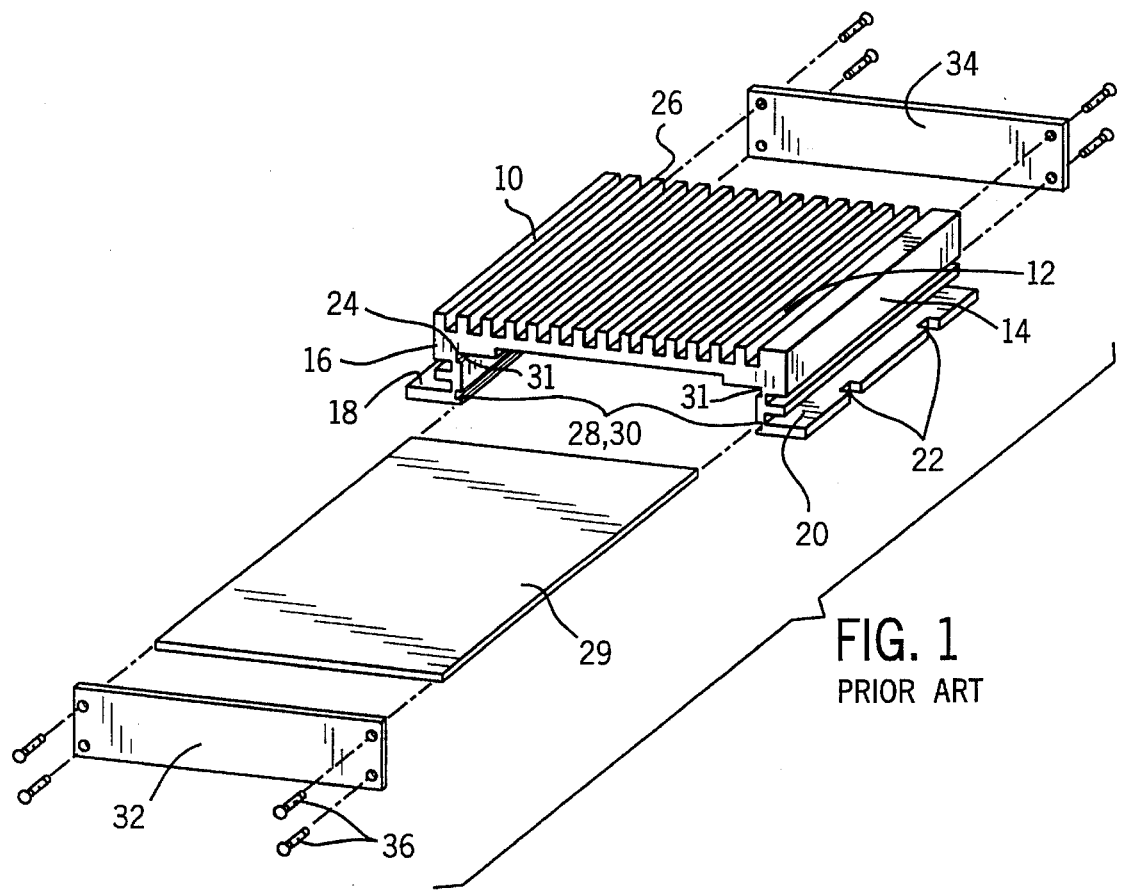
FIG. 1 is an exploded perspective view of a prior art amplifier housing.

Referring now to FIG. 2, the inventive amplifier housing 40 includes a top heat sink member 42, a front bottom plate 44, a back bottom plate 46, and four foot extensions 48.

The top heat sink member 42 includes two lateral walls 52, 54 each having upper and lower ends 56, 58 respectively. The top heat sink member 42 also includes a top wall 50 which traverses the distance between the two lateral walls 52, 54 connecting the upper ends. As well known in the art, the external surfaces of the top and lateral walls 50, 52, 54 define a plurality of ribs 60 which increases the external surface area of the heat sink member 42 for heat dissipation purposes.

Preferably, the bottom edge of each lower end 56, 58 of each lateral wall 52, 54 defines a downwardly facing shelf 62, 64 which is used to align and help secure the bottom plates 44, 46 in an operational position which will be described in more detail below. Eight bores (not shown) extend upwardly, four into each shelf 62, 64 for securing bottom plates 44, 46. Typically, the heat sink 42 will be formed by extruding aluminum or some other suitable heat conducting material such as ceramic or the like. Front and back edges 51, 53, respectively, of the top heat sink member 42 define front and back open heat sink faces 74 and the internal surface 37 of the heat sink 42 defines a space 39 for housing electronic amplifier components (inlet and outlet portions of which are shown in FIG. 6).

Both the front and back bottom plates 44, 46 are formed of medium gauge sheet metal, each plate 44, 46 being bent at a joint to form two separate bottom plate sections. Referring to the front bottom plate 44, the sheet metal is bent to form a bottom wall section 66 and an upright front wall section 68. Similarly, the back bottom plate 46 sheet metal is bent to form a second bottom wall section 70 and an upright back wall section 72.

Each upright wall section 68, 72 should be defined by an edge 45 or 47 which complements the shape defined by the internal surface of the heat sink 42. Thus, in FIG. 2, where the internal surface of heat sink 42 dips down slightly 49, edge 45 dips downwardly in a complementary fashion. Each upright wall section 68, 72 also defines a plurality of openings generally referred to by number 69. The openings provide inlet and outlet ports for electrical connections between amplifier components and external electronics as well known in the art.

Each bottom section 66, 70 is defined by internal 96, external 97 and oppositely facing lateral 81, 83 edges and defines a plurality of securing bores 73, two bores spaced apart along each lateral edge 81, 83. Each securing bore 73 is located near the corner of a bottom section 66 or 70 and aligned with similarly sized and spaced holes (not shown) in the shelves 62, 64.

For the purposes of this description, securing bores closest to the external edge 97 will be referred to as external bores 73' and 73". Two additional alignments or key holes 85', 85" are provided along each lateral edge 81, 83 one on either side of each external bore 73', 73". The key holes 85', 85" operate to help align the mounting foot extensions 48 as will be described in more detail below.

Importantly, the top heat sink member 42 does not include mounting flanges which extend laterally outwardly for mounting the amplifier to an automobile chassis or the like. Instead, the amplifier is mounted by use of the four separate foot extensions 48 which extend outwardly past the front and back edges 51, 53 of the heat sink 42.

Referring now to FIG. 3, each foot extension 48 includes a head portion 78 and a neck portion 80 having a reduced width relative to the head portion 78. Referring also to FIG. 4, the head and neck portions 78, 80 together define top and bottom surfaces 81, 82 respectively. The bottom surface 82 is generally flat while the top surface 81 defines a raised head 78 and two keyed protrusions 84', 84". The two keyed protrusions 84', 84" extend upwardly in the direction of the head portion 78 extension but extend upwardly to a lesser degree than the head portion. Two counter sunk bores are provided in the foot extension 48. A small counter sunk bore 86 is directed from the bottom surface 82 upwardly through the neck portion 80 between the keyed protrusions 84', 84". A second, relatively larger bore 88 extends through a central area of the head portion 78 in a direction opposite the small bore 86 toward the bottom surface 82.

The small bore 86 and two keyed protrusions 84', 84" should be arranged so that when one keyed protrusion 84' is received in key hole 85', the other protrusion 84" is receivable in key hole 85" and, when both keyed protrusions 84', 84" are received in associated key holes 85', 85", the small bore 86 is aligned with an associated external hole 73' or 73".

Referring again to FIG. 2, in a preferred embodiment, eight screws 90 are provided for securing the housing and mounting components together. To assemble the inventive housing, after amplifier electronic components have been installed within space 39, the front and back bottom plates 44, 46 are positioned beneath the top heat sink member 42 so that holes 73 align with bores in the heat sink shelves 62, 64, the upright front wall 68 is flush with the front edge 51 of the sink 42 and the upright back wall 72 is flush with the back edge 53 of the sink 42, and the bottom wall sections 66, 70 traverse the area defined by shelves 62, 64.

Figure 5:
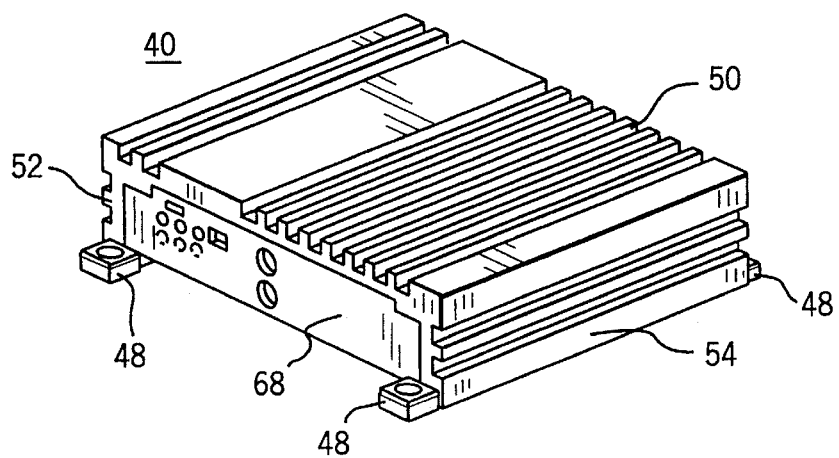
FIG. 5 is a perspective view of the housing and mounting assembly assembled.

Referring to FIGS. 2 and 5, when so positioned, the upright front and back walls 68, 72 each close off either the front or back heat sink face 74, the edges 45, 47 precisely following the heat sink internal surface 37. Preferably, when so positioned, the front and back edges 51, 53 of the sink 42 are either flush with or slightly overhang the external faces of upright walls 68, 72. and any amplifier component hook-ups (generally 25) extend out through holes 69

Referring also to FIG. 6, the bottom sections 66, 70 should be formed so that, when properly positioned, a small continuous gap 92 is defined between the internal edges 96 of the two bottom sections 66, 70. The gap 92 should traverse the entire distance between the shelves 62, 64, thus eliminating any possibility of a continuous electrical short circuit across the plates. Preferably, the gap should be relatively narrow, so as to eliminate the possibility of items falling through the gap into space 39.

Referring to FIGS. 2, 3, 4, and 6, with the bottom plates 44, 46 positioned as described above, the foot extensions 48 can be positioned so that small bores 86 align with holes 73' and 73", protrusions 84', 84" align with holes 85', 85", and head portions 78 extend outwardly in directions perpendicular to front and back walls 68, 72. Next, a securing screw 90 can be placed through each small bore 86 and tightened into place. Four additional securing screws 90 can then be secured in the remaining holes 73.

To mount the housing 40, the housing is preferably placed on a flat surface and mounting bolts (not shown) are placed through large bores 88 and tightened. To eliminate ground loop noise, the housing 40 is electrically separated from an automobile chassis by forming the foot extensions with a non-conductive material. Preferably, the foot extension material chosen is a resilient and pliable non-conductor so that, even where a mounting surface is not entirely flat, the amplifier can be securely connected as the foot extensions 48 will bend slightly. It has been found that a good material for forming the extensions 48 is glass reinforced nylon.

Thus, a simple and reliable amplifier housing has been described. The inventive housing uses minimal inexpensive components which together provide a relatively finished looking housing. In addition, the inventive housing is electrically insulated from an automobile chassis by a mounting system including non-conducting compliant foot extensions which minimize ground loop noise and which allow the amplifier to be mounted to uneven surfaces. Moreover, the split bottom plates eliminate a major magnetic flux path for transformer generated flux and thereby minimize amplifier noise.

Figure 6A:
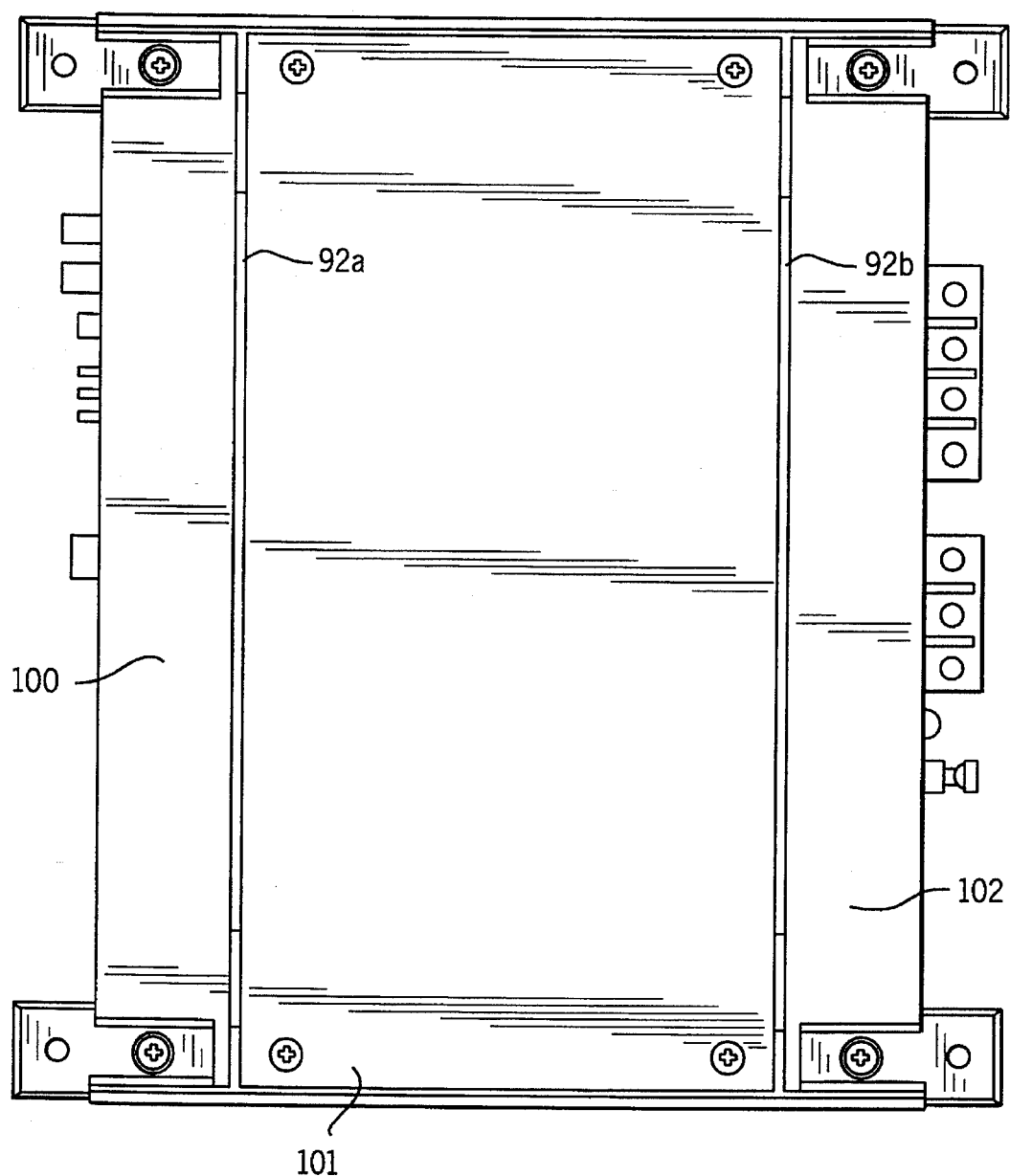
FIG. 6A is a bottom perspective view of a second preferred embodiment of the housing according to the present invention.

Although the preferred embodiment of the invention has been described above, the invention claimed is not so restricted. For example, while the preferred embodiment has been described as having two bottom plates 66, 70, clearly, the invention also contemplates designs where more than two bottom plates are provided so that more than one gap 92a, 92b (see FIG. 6A) exists in the bottom wall of the housing, thus further breaking up the magnetic flux path therethrough. In FIG. 6A, all of the components shown are similar to the components shown in FIG. 6 except for the bottom plate configuration. Similar components will not be explained here again in detail. In FIG. 6A, instead of two bottom plates as seen in FIG. 6, three bottom plates 100, 101 and 102 are provided, the three bottom plates forming two distinct gaps 92a, 92b which traverse the entire bottom. In addition, the foot extensions 48 may be of other forms which extend it downwardly further for accommodating exceptionally uneven surfaces, the foot extensions being of different sizes and shapes (i.e. one foot extension may extend downwardly further than all of the others). Moreover, while the upright walls 68, 72 are shown as being complimentary to the internal surface 37 of the heat sink 42, the present invention also covers designs where the upright walls 68, 72 are positioned outside edges 51, 53 of heat sink 42 when in an operational position, being flush with those edges 51, 53.

While the present invention is described as having fully complementary adjacent keyed patterns for locking purposes, the keyed patterns may in fact be only partially complementary, non-complimentary portions designed so that they do not impede the complementary portions of the surfaces from interlocking. Thus, the invention is not limited by the specific description above, rather it should be judged by the claims which follow.

We claim:

1. An amplifier housing comprising:

A top heat sink member including oppositely facing first and second lateral walls, each lateral wall having an upper and a lower end, the top member also including a top wall defined by four edges, two oppositely facing edges of the top wall connected to the upper ends and traversing the distance between the lateral walls, the other two oppositely facing edges of the top wall and adjacent edges of the two lateral walls forming front and back open faces, the other two oppositely facing edges being front and back edges of the top heat sink member; and front and back bottom plates, each bottom plate including a bottom section having oppositely facing internal and external edges and oppositely facing first and second lateral edges, the front and back bottom plates also including upright front and back end walls respectively, each end wall extending upwardly from said external edges;

whereby, when assembled the bottom sections traverse the distance between the lower ends of the lateral walls, the bottom sections together traversing less than the entire distance between the front and back edges of said top member, the front and back upright end walls substantially blocking said front and back open faces respectively.

2. The housing of claim 1 further including at least one foot extension removably secured to a bottom surface of one of said bottom sections.

3. The housing of claim 2 wherein said at least one extension member includes two pairs of extension members, each pair of extension members connected to a different bottom section.

4. The housing as recited in claim 3 wherein each of the extension members if formed of an electrically insulating material.

5. The housing of claim 1 further including at least one middle bottom plate positioned between the front and back bottom plates, a gap existing between each two adjacent bottom plates.

6. The housing of claim 1 wherein each of the front and back bottom plates traverses approximately half the distance between the front and back edges of said top member.

7. The housing of claim 3 wherein the extension members are formed of a pliable and resilient material.

8. The housing of claim 1 wherein the lower end of each lateral wall defines a downwardly facing shelf, the shelves openly facing each other and wherein the bottom sections are sized so as to be received between said shelves.

9. The housing of claim 1 wherein the bottom plates are secured to the top heat sink member by fastening means between the bottom sections and the lower ends of the lateral walls.

10. The housing of claim 9 wherein the fastening means are a plurality of screws which extend through the bottom sections and into said lower ends.

11. The housing of claim 1 wherein the upright front and back walls are positioned so as to be flush with said other two oppositely facing edges of said top wall.

\* \* \* \* \*